United States Patent
Chen et al.

(10) Patent No.: US 8,367,218 B2
(45) Date of Patent: Feb. 5, 2013

(54) WHITE ORGANIC ELECTROLUMINESCENT ELEMENTS AND DISPLAYS USING THE SAME

(75) Inventors: Chin-Hsin Chen, Hsinchu (TW); Shih-Feng Hsu, Hsinchu (TW); Hsiao-Wen Huang, Hsinchu (TW); Chung-Chun Lee, Hsinchu (TW); Shi-Hao Li, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 1039 days.

(21) Appl. No.: 11/654,706

(22) Filed: Jan. 18, 2007

(65) Prior Publication Data

US 2008/0070033 A1 Mar. 20, 2008

(30) Foreign Application Priority Data

Sep. 18, 2006 (TW) ................................ 95134438 A

(51) Int. Cl.
*B32B 15/00* (2006.01)
*B32B 9/00* (2006.01)
(52) U.S. Cl. .......... 428/690; 257/40; 428/457; 428/917; 428/411.1
(58) Field of Classification Search .................. None
See application file for complete search history.

(56) References Cited

U.S. PATENT DOCUMENTS

| | | | |
|---|---|---|---|
| 5,503,910 A * | 4/1996 | Matsuura et al. | ............. 428/212 |
| 6,110,633 A | 8/2000 | Atarashi et al. | |
| 6,737,800 B1 | 5/2004 | Winters et al. | |
| 6,876,144 B2 | 4/2005 | Peng | |

(Continued)

FOREIGN PATENT DOCUMENTS

| CN | 1541034 A | 10/2004 |
|---|---|---|
| CN | 1674750 A | 9/2005 |

(Continued)

OTHER PUBLICATIONS

Liu, et al., Highly Efficient Yellow and White Organic Electroluminescent Devices Doped with 2, 8-di(t-butyl)-5, 11-di[4-(t-butyl)phenyl]-6, 12-diphenylnaphthacene, Applied Physics Letters, Nov. 8, 2004, pp. 4304-4306, vol. 85, No. 19.

Office Action, dated Oct. 22, 2009, received in Taiwanese patent application No. 095134438, 7 pgs.

(Continued)

*Primary Examiner* — Jennifer Chriss
*Assistant Examiner* — J. L. Yang
(74) *Attorney, Agent, or Firm* — McClure, Qualey & Rodack, LLP

(57) ABSTRACT

A white organic electroluminescent element for an organic electroluminescent display and a display using the white organic electroluminescent are provided. The organic electroluminescent display comprises a white organic electroluminescent element and a color filter. The white organic electroluminescent element comprises an anode, a cathode, a capping layer, and an organic layer. The capping layer is disposed on the cathode. The organic layer is disposed between the anode and the cathode, and comprises a blue light emitting layer. The thickness of the organic layer is X+120N nm, wherein $85 \leq X \leq 125$, and N=0, 1, or 2. The white organic electroluminescent element is configured to emit a white light. The color filter is configured to convert the white light to a first color beam, with the first color beam being either red, blue, or green.

10 Claims, 3 Drawing Sheets

U.S. PATENT DOCUMENTS

| | | |
|---|---|---|
| 2002/0109458 A1 | 8/2002 | Pichler et al. |
| 2004/0258958 A1 | 12/2004 | Cheng et al. |
| 2005/0064235 A1 | 3/2005 | Liao et al. |
| 2005/0099114 A1 | 5/2005 | Wu et al. |
| 2005/0208327 A1 | 9/2005 | Begley et al. |
| 2005/0212414 A1 | 9/2005 | Matsusue et al. |
| 2005/0264185 A1 | 12/2005 | Hoffmann |
| 2006/0158098 A1* | 7/2006 | Raychaudhuri et al. ...... 313/503 |
| 2007/0228938 A1* | 10/2007 | Hatwar et al. ................ 313/504 |
| 2007/0241669 A1* | 10/2007 | Liu et al. ..................... 313/504 |
| 2008/0003455 A1* | 1/2008 | Li et al. ....................... 428/690 |

FOREIGN PATENT DOCUMENTS

| | | |
|---|---|---|
| TW | 292369 | 6/2000 |
| WO | WO 2006/061954 A1 * | 6/2006 |

OTHER PUBLICATIONS

Translation of abstract and cited portions of Chinese Patent Publication No. CN1541034A, as provided by Taiwanese associate, 8 pgs, Oct. 27, 2004.

* cited by examiner

WHITE ORGANIC ELECTROLUMINESCENT ELEMENTS AND DISPLAYS USING THE SAME

This application benefits from the priority of Taiwan Patent Application No. 095134438 filed on Sep. 18, 2006.

BACKGROUND OF THE INVENTION

1. Field of the Invention

The present invention relates to a white organic electroluminescent element; in particular, the invention relates to a white organic electroluminescent element adapted for an organic electroluminescent display.

2. Descriptions of the Related Art

Full color technology, widely-used in the organic electroluminescent element industrial field, is broadly classified into three categories: (1) RGB side-by-side pattern, (2) color conversion, and (3) white organic electroluminescent element with a color filter. The RGB side-by-side pattern is only adapted for the evaporation of a micro element, and the color conversion color further requires a conversion layer.

Though the white organic electroluminescent element technology has been improved, there are still some technical problems needing to be resolved, wherein the complexity of element is one issue. It is required that a plurality of dopants are doped into a light emitting layer of the white organic electroluminescent element. Or, an incomplete energy transfer from a host to dopant(s) is required, to enable the host and dopant(s) illuminate simultaneously to form a white light.

Thus, the industrial field urgently requires a white organic electroluminescent element with a larger work window that is adapted for full color technology.

SUMMARY OF THE INVENTION

An object of this invention is to provide a white organic electroluminescent element. The organic electroluminescent element comprises an anode, a cathode, a capping layer, and an organic layer. The capping layer is disposed on the cathode, and the organic layer is disposed between the anode and the cathode. The organic layer comprises a blue light emitting layer. The thickness of the organic layer is X+120N nm, wherein $85 \leq X \leq 125$, and N=0, 1, or 2.

Another object of this invention is to provide an organic electroluminescent display. The organic electroluminescent display comprises the white organic electroluminescent element as recited above and a color filter. The white organic electroluminescent element is configured to emit a white light. The color filter is configured to convert the white light to a first color beam of red, blue or green color.

With a simple adjustment of the thickness of the light emitting layer of the white organic electroluminescent element, the present invention provides a white organic electroluminescent element that emits white light. The present invention increases the work window of the full color technology.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
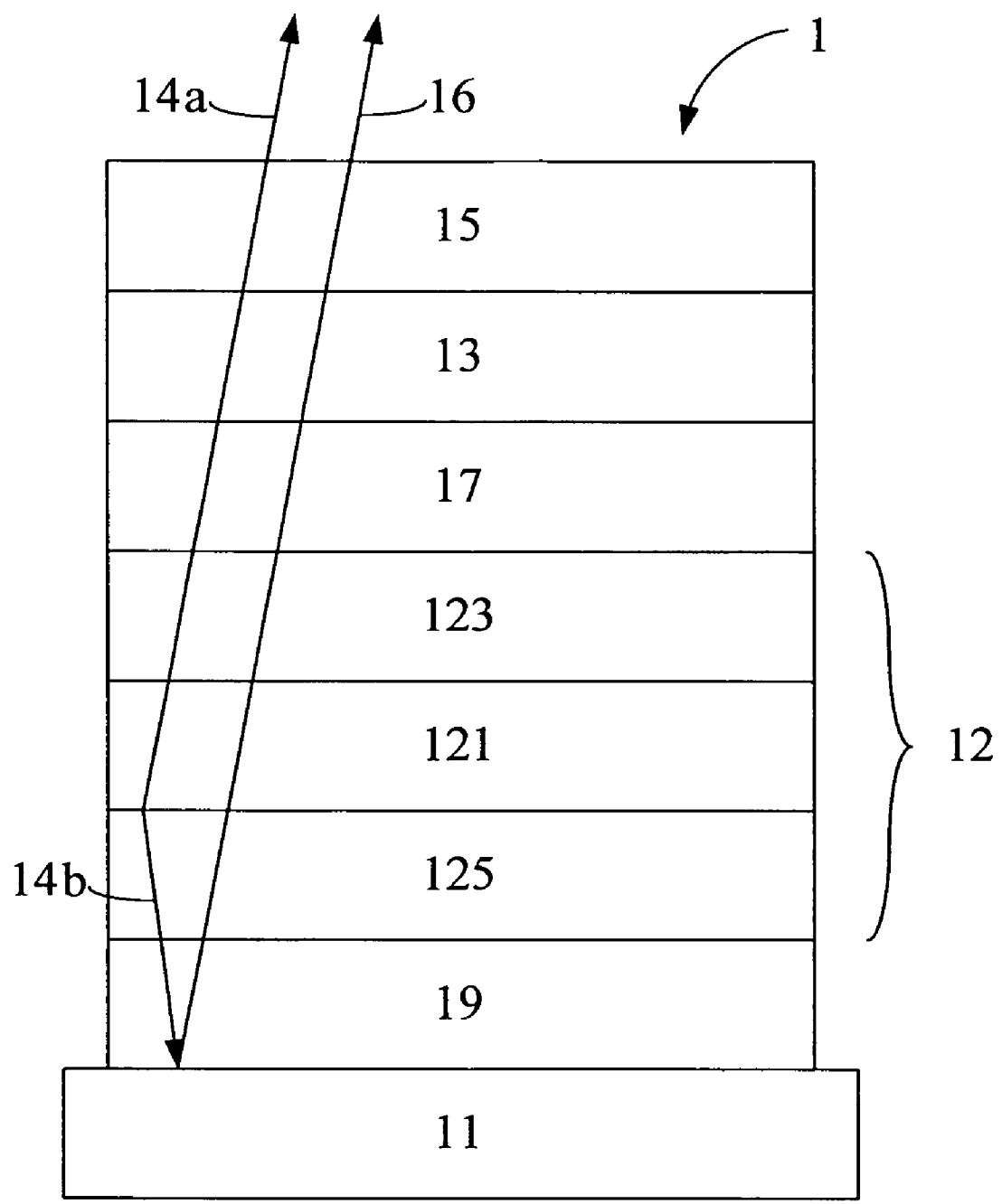
FIG. 1 shows a schematic sectional view of a first embodiment in accordance with the present invention.

A first embodiment of the present invention is a white organic electroluminescent element 1 as shown in FIG. 1. The white organic electroluminescent element 1 comprises an anode 11, a cathode 13, a capping layer 15, an electron injection layer (EIL) 17, a hole injection layer (HIL) 19, and an organic layer 12. The capping layer 15 is above the cathode 13, while the EIL 17, the HIL 19, and the organic layer 12 are disposed between the anode 11 and the cathode 13. The organic layer 12 is disposed between the EIL 17 and the HIL 19. The organic layer 12 comprises a blue light emitting layer 121, an electron transporting layer (ETL) 123 disposed between the blue light emitting layer 121 and the cathode 13, and a hole transporting layer (HTL) 125 disposed between the blue light emitting layer 121 and the anode 11.

In the white organic electroluminescent element 1 of the present invention, the anode 11 is disposed above a substrate. The anode not only serves as an electrode, but may also reflect lights. Therefore, the anode 11 is preferably selected from a group consisting of opaque and reflective materials: gold, silver, aluminum, aluminum-rubidium alloy, molybdenum, chromium, and the likes.

In the white organic electroluminescent element 1, the lights emitted from the light emitting layer(s) are emitted out from the cathode 13, serving as an electrode. Therefore, the cathode 13 should have a particular transparency. The cathode 13 is preferably selected from a group consisting of semitransparent materials: metal, transparent metal oxide, and combinations thereof. For example, but are not limited to, the metal can be aluminum, calcium, magnesium, indium, tin, manganese, silver, gold, magnesium alloy, magnesium-tin alloy, magnesium-antimony alloy, magnesium-tellurium alloy, magnesium-silver alloy, magnesium-indium alloy, aluminum-lithium alloy, and the likes. Furthermore, the transparent metal oxide can be indium tin oxide alloy (ITO), indium zinc oxide alloy (IZO), indium oxide-zinc oxide alloy ($In_2O_3$—ZnO), zinc oxide, and the likes. Generally speaking, the adoption of a thinner film layer for the cathode 13 would be preferable, as far as the layer can serve the desired functions. For example, for a silver cathode 13 that has a workable thickness ranging from 15 nm to 20 nm, a preferable thickness of the cathode 13 is 15 nm.

The capping layer 15 on top of the white organic electroluminescent element 1 is configured to increase the transparency of the portion above the light emitting layer of the element. A material with a higher transparency than that of the cathode 13 is preferred for the capping layer 15. For example, but are not limited to, the capping layer 15 can be tris(8-hydroxyquinoline)aluminum ($Alq_3$), zinc-tin oxide (ZTO), tin dioxide ($SnO_x$), indium oxide ($InO_x$), molybdnum oxide ($MoO_x$) tellurium dioxide ($TeO_x$), antimony oxide ($SbO_x$), zinc oxide ($ZnO_x$), zinc selenide (ZnSe), and zinc telluride (ZnTe). Preferably, the material for the capping layer 15 can be $Alq_3$, $SnO_2$, $TeO_2$, ZnSe, and ZnTe. For example, when using $SnO_2$ to provide the capping layer 15, it is preferred that the thickness of the capping layer 15 ranges from 10 nm to 20 nm, and a thickness of 15 nm is more preferred.

The EIL 17 is disposed between the cathode 13 and the organic layer 12 to enhance the injection of electrons from the cathode 13 to the organic layer 12. The material of EIL 17 is selected from a group consisting of alkaline metals, alkaline earth metals, and combinations thereof. The alkaline metal can be lithium, sodium, potassium, rubidium, or cesium. The alkaline earth metal can be magnesium, calcium, strontium, or barium. If calcium is used for the EIL 17, it is preferred that the thickness of the EIL 17 ranges from 1 nm to 10 nm, and a thickness of 5 nm is more preferred. The EIL 17 is an optional layer to the white organic electroluminescent element 1 of the present embodiment. Thus, FIG. 1 illustrates an embodiment of the present invention, with the knowledge that the EIL 17 is not always necessary for application.

The HIL 19 is disposed between the anode 11 and the organic layer 12 to enhance the injection of holes from the anode 11 to the organic layer 12. Suitable materials for the HIL 19 comprise, but are not limited to: $CF_x$, wherein $0<x\leq 2$, copper phthalocyanine (CuPc), 4,4',4''-Tris(N-(2-naphthyl)-N-phenyl-amino)-triphenylamine (2-TNATA), and the likes. HIL 19 is not always necessary for the white organic electroluminescent element 1 of the present invention. People skilled in the art may omit HIL 19 depending on the actual requirements.

The organic layer 12 comprises a blue light emitting layer 121, an ETL disposed between the blue light emitting layer 121 and the cathode 13, and a HTL disposed between the blue light emitting layer 121 and the anode 125. The blue light emitting layer 121 has a thickness ranging from 10 nm to 50 nm depending on the type of material. For example, when the blue light emitting layer 121 is a 2-methyl-9,10-di(2-naphthyl)anthracene (MADN) layer doped with 3% p-bis[p-N,N-diphenyl-amino-styryl]benzene (DSA-Ph), its thickness can be 30 nm. Other suitable materials for the host material of the blue light emitting layer 121 comprise, but are not limited to, anthracene derivatives, oxadiazole derivatives, such as 1,3-bis(4-t-butylphenyl-1,3,4-oxadizolyl)phenylene (OXD), 1,2,4-triazole derivative (TAZ), distyrylbenzene (DSB), or distyrylarylene derivatives (DSA), such as 4,4'-bis(2,2'-diphenyl vinyl)-1,1'-biphenyl (DPVBi) and 1,4-bis[2-(3-N-ethyl-carbazoryl)vinyl]benzene (BCzVB). Suitable materials for the dopants comprise, but are not limited to, parylene, 2,5-bis(5-tert-butyl-2-benzoxazolyl) thiophene (BBOT), N-arylbenzimidazoles (TPBI), and the likes.

The ETL 123 has a thickness that ranges from 10 nm to 50 nm, depending on the materials of the ETL 123. For example, when using $Alq_3$ to provide the ETL 123, the thickness of the ETL 123 can be 30 nm. Other materials which can be used to provide the ETL 123 comprise, but are not limited to, metal chelated oxinoid compound, i.e. 8-quinolinol or 8-hydroxyquinoline, and butadiene derivatives.

The HTL 125 has a thickness that ranges from 40 nm to 50 nm, depending on the type of its material(s). For example, when using N,N'-di(naphthalene-1-yl)-N,N'-diphenyl-benzidine (NPB) for the HTL 125, the thickness of the HTL 125 can be 45 nm. Aromatic tertiary amines can also used for the HTL 125. The aromatic tertiary amines comprise at least one trivalent nitrogen that is bonded to a carbon atom, and has at least one aromatic ring. The aromatic tertiary amine can be an arylamine, such as a monoaryl amine, a diarylamine, a triarylamine, and polymeric arylamine. For example, N,N'-di(naphthalene-1-yl)-N,N'-diphenyl-benzidine(NPB), N,N,N',N'-tetranaphthyl-benzidine (TNB), N,N'-diphenyl-N,N'-bis(3-methylphenyl)-1-1'-biphenyl-4-4'-diamine (TPD), and 4,4',4''-tris(3-methyl-phenylphenylamino)-triphenylamine (MTDATA) are suitable arylamines. The HTL 125 can also be of a polycyclic aromatic compound, such as poly(vinyltriphenylamine (PVT) and poly(n-vinylcarbazole) (PVK).

As shown in FIG. 1, the blue light emitting layer 121 emits blue lights 14a and 14b. The blue light 14a emits-upward, passing through the ETL 123, the EIL 17, the cathode 13, and the capping layer 15 sequentially. The blue light 14b emits downward, passing through the HTL 125 and the HIL 19, and is reflected as a light 16. The light 16 sequentially passes through the HIL 19, the HTL 125, the blue light emitting layer 121, the ETL 123, the EIL 17, the cathode 13, and the capping layer 15, and emits out. The reflected light 16 passes a micro-cavity formed by the aforementioned layers, and changes from blue to other colors.

When adjusting the depth of the micro-cavity, i.e. adjusting a total thickness of the organic layer 12 to (X+120N) nm, wherein $85\leq X\leq 125$, $N\geq 0$, and N is an integer, the blue light 14b would be reflected as a yellow reflected light 16. The blue light 14a and the yellow light (light 16) would be blended as a white light due to the constructive interference, thereby providing the white organic electroluminescent element 1. Preferably, the thickness of the organic layer 12 is (X+120N) nm, wherein $85\leq X\leq 125$ and N=0, 1, or 2. That is, the preferred thickness range of the organic layer 12 is: $85\leq X\leq 125$, $205\leq X\leq 245$, or $325\leq X\leq 365$.

Figure 2:
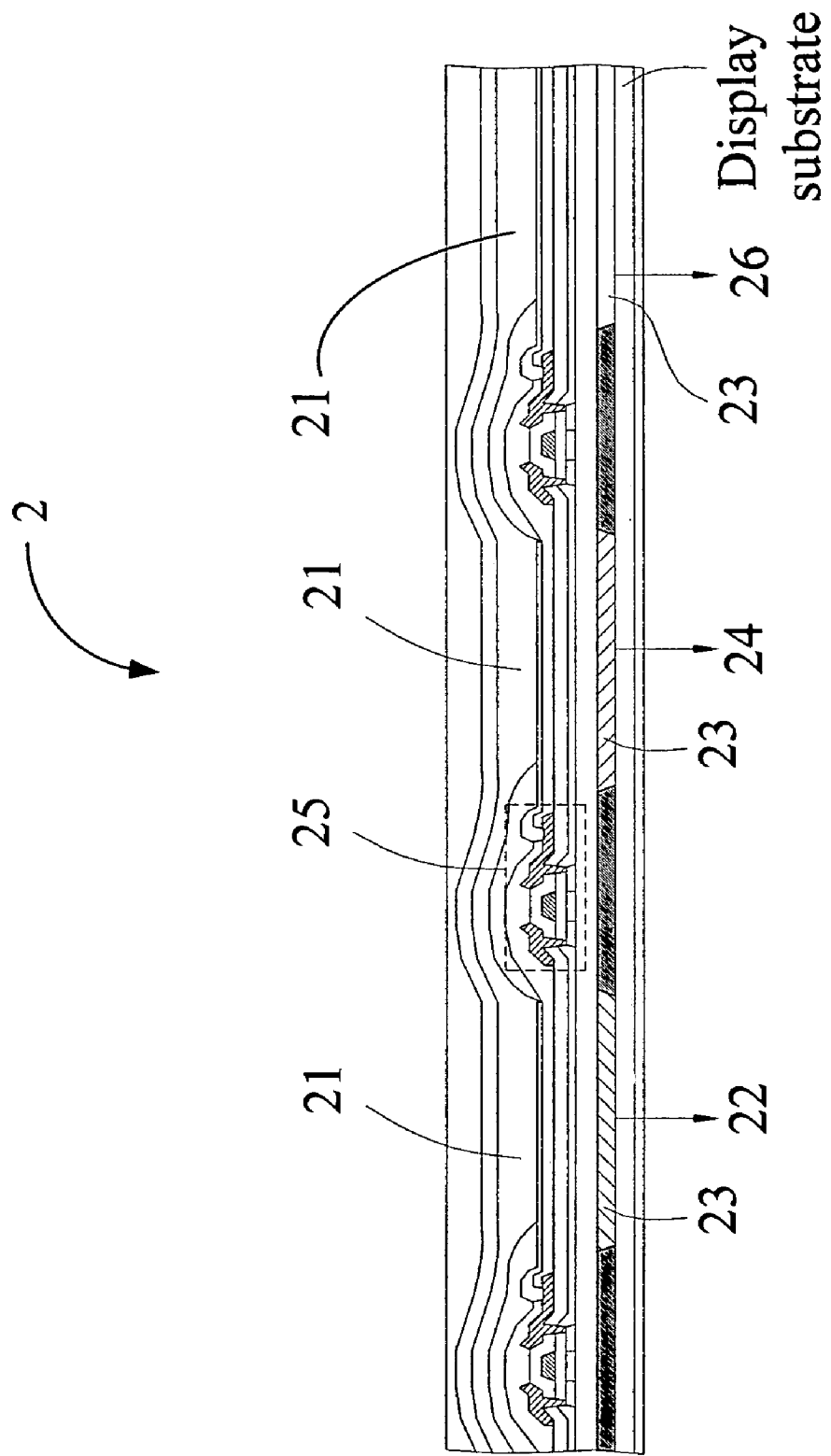
FIG. 2 shows a schematic sectional view of a second embodiment in accordance with the present invention.

The second embodiment of the present invention is an organic electroluminescent display 2, as shown in FIG. 2. The organic electroluminescent display 2 comprises the three aforementioned white organic electroluminescent elements 21, three color filters 23, and three corresponding driving circuits 25. The three color filter 23, corresponding to the three white organic electroluminescent elements, are configured to transfer the white lights emitted from the three white organic electroluminescent elements 21 to a first color beam 22, a second color beam 24, and a third color beam 26. The first color beam 22 is a red light, the second color beam 24 is a blue light, and the third color beam 26 is a green light. The three corresponding driving circuits 25 control the on or off states of the red light, the blue light, and the green light respectively for displaying different colors.

Figure 3:
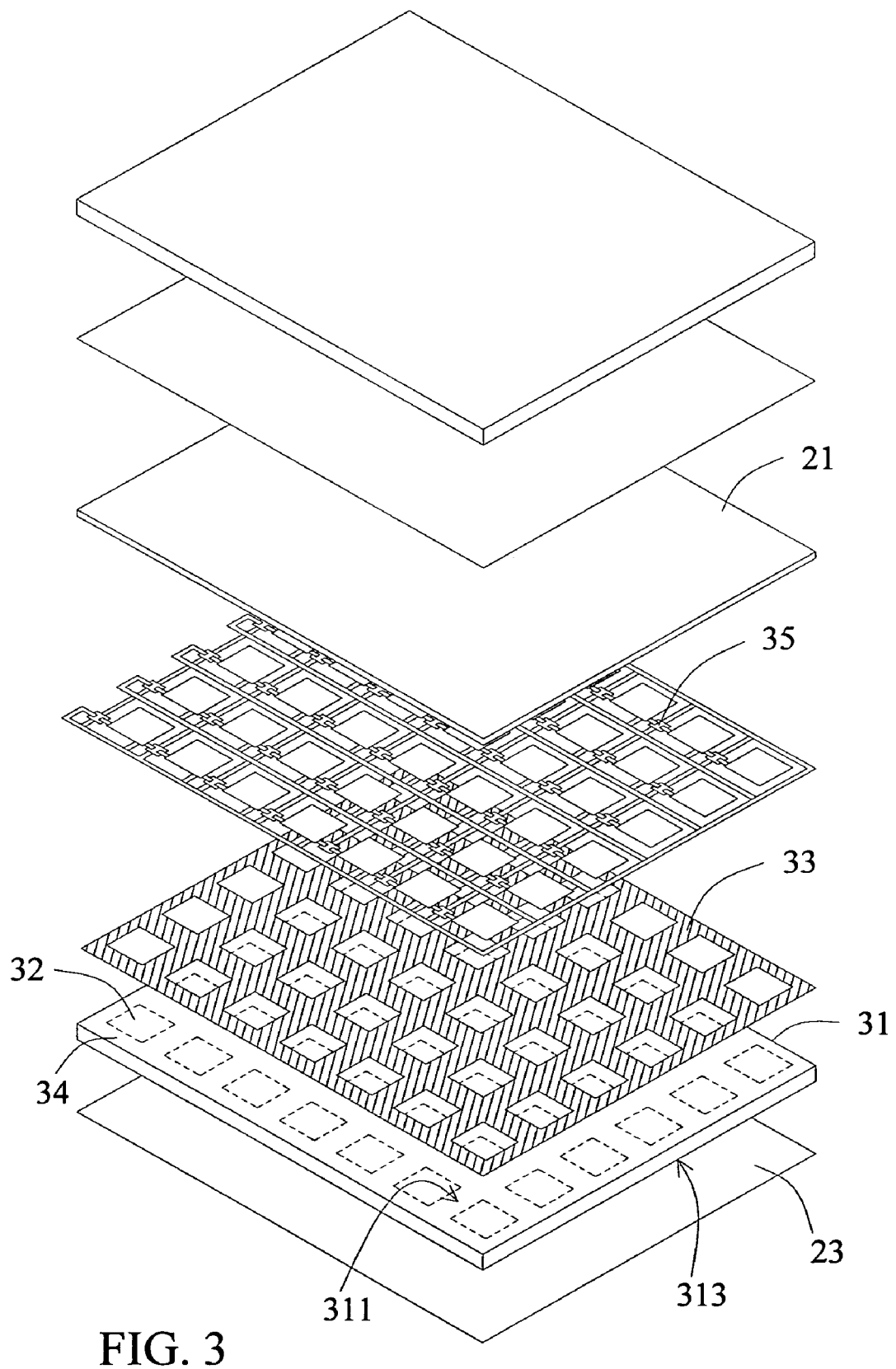
FIG. 3 shows an exploded view of the second embodiment in accordance with the present invention.

FIG. 3 is an exploded view of the aforementioned organic electroluminescent display 2. The organic electroluminescent display 2 not only comprises the aforementioned white organic electroluminescent elements 21 and color filters 23, but also comprises a display panel 31, a dark light absorbing structure 33, and a driving circuit element 35. The display panel 31 comprises an inner surface 311 and an outer surface 313. The dark light absorbing structure 33, driving circuit element 35, and white organic electroluminescent elements 21 are all formed on the inner surface side of the display panel 31, while the color filters 23 are preferably formed on the outer surface side of the display panel 31. The inner surface 311 of the display panel 31 comprises an illumination area 32 and a non-illumination area 34. With the aforementioned description, the present invention only uses the white organic electroluminescent elements 21 and color filters 23 to achieve the full color of the display 2 without the limitations of an operation environment and special materials; Thus, the full color process can be simplified, while broadening the processing work window.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A white organic electroluminescent element, comprising:
   a reflective anode;
   a semitransparent or transparent cathode;
   a capping layer disposed on the cathode; and
   an organic layer disposed between the anode and the cathode,
   wherein the organic layer forms a micro-cavity and is a single light emitting component configured as a blue light emitting layer, an electron transporting layer disposed between the blue light emitting layer and the cathode, and a hole transporting layer disposed between the blue light emitting layer and the anode,
   wherein a thickness of the blue light emitting layer is from 10 nm to 50 nm, a thickness of the electron transporting layer is from 10 nm to 50 nm, a thickness of the hole transporting layer is from 40 nm to 50 nm, and the organic layer has a thickness of X+120N nm, $85 \leq X \leq 125$, and N=0, 1, or 2, so that a first part of the blue light emitted from the blue light emitting layer is reflected by the anode as a reflected light, the reflected light being converted to a yellow reflected light within the micro-cavity and interfering with a second part of the blue light emitted from the blue light emitting layer to produce white light emitted from the cathode.

2. The white organic electroluminescent element as claimed in claim 1, wherein the anode is comprised of silver, aluminum, aluminum-rubidium alloy, molybdenum, chromium and combinations thereof.

3. The white organic electroluminescent element as claimed in claim 1, wherein the cathode is comprised of metal, transparent metal oxide, and combinations thereof.

4. The white organic electroluminescent element as claimed in claim 1, wherein the capping layer is comprised of Tris(8-hydroxyquinoline)aluminum ($Alq_3$), tin dioxide ($SnO_2$), tellurium dioxide ($TeO_2$), zinc selenide (ZnSe), zinc telluride (ZnTe) and combinations thereof.

5. The white organic electroluminescent element as claimed in claim 1, further comprising an electron injection layer disposed between the cathode and the organic layer.

6. The white organic electroluminescent element as claimed in claim 5, wherein the electron injection layer is comprised of alkaline metal, alkaline earth metal, and combinations thereof.

7. The white organic electroluminescent element as claimed in claim 1, wherein the blue light emitting layer comprises a 2-methyl-9,10-di(2-naphthyl) anthracene (MADN) layer doped with p-bis[p-N,N-diphenyl-aminostyryl]benzene (DSA-Ph).

8. The white organic electroluminescent element as claimed in claim 1, wherein the electron transporting layer comprises a Tris(8-hydroxyquinoline)aluminum ($Alq_3$) layer.

9. The white organic electroluminescent element as claimed in claim 1, wherein the hole transporting layer comprises a N,N'-di(naphthalene-1-yl)-N,N'- diphenyl-benzidine (NPB) layer.

10. An organic electroluminescent display, comprising:
    the white organic electroluminescent element as recited in claim 1 for emitting a white light; and
    a color filter for converting the white light to a first color beam.

* * * * *